(12) United States Patent
Lee et al.

(10) Patent No.: US 12,073,895 B2
(45) Date of Patent: Aug. 27, 2024

(54) GANGED SINGLE LEVEL CELL VERIFY IN A MEMORY DEVICE

(71) Applicant: Micron Technology, Inc., Boise, ID (US)

(72) Inventors: Eric N. Lee, San Jose, CA (US); Tomoko Ogura Iwasaki, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 189 days.

(21) Appl. No.: 17/683,153

(22) Filed: Feb. 28, 2022

(65) Prior Publication Data

US 2023/0070208 A1    Mar. 9, 2023

Related U.S. Application Data

(60) Provisional application No. 63/261,003, filed on Sep. 8, 2021.

(51) Int. Cl.
| | |
|---|---|
| G11C 16/34 | (2006.01) |
| G11C 16/08 | (2006.01) |
| G11C 16/10 | (2006.01) |
| G11C 16/24 | (2006.01) |
| G11C 16/26 | (2006.01) |
| G11C 16/30 | (2006.01) |

(52) U.S. Cl.
CPC .......... *G11C 16/3459* (2013.01); *G11C 16/08* (2013.01); *G11C 16/102* (2013.01); *G11C 16/24* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 2005/0057972 A1* | 3/2005 | Taito | G11C 16/3418 365/185.28 |
| 2011/0013458 A1* | 1/2011 | Seol | H10B 41/20 365/189.04 |

\* cited by examiner

*Primary Examiner* — Alfredo Bermudez Lozada
(74) *Attorney, Agent, or Firm* — LOWENSTEIN SANDLER LLP

(57) ABSTRACT

Control logic in a memory device identifies a set of memory cells in a block of a memory array, wherein the set of memory cells comprises two or more memory cells programmed during a program phase of a program operation and associated with a selected wordline of the memory array. The control logic further causes a program verify voltage to be applied to the selected wordline during a program verify phase of the program operation and performs concurrent sensing operations on the set of memory cells to determine whether each memory cell in the set of memory cells was programmed to at least the program verify voltage during the program phase of the program operation.

20 Claims, 6 Drawing Sheets

GANGED SINGLE LEVEL CELL VERIFY IN A MEMORY DEVICE

RELATED APPLICATION

This application claims the benefit of U.S. Provisional Application Ser. No. 63/261,003, filed Sep. 8, 2021, which is herein incorporated by reference in its entirety.

TECHNICAL FIELD

Embodiments of the disclosure relate generally to memory sub-systems, and more specifically, relate to ganged single level cell (SLC) verify in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
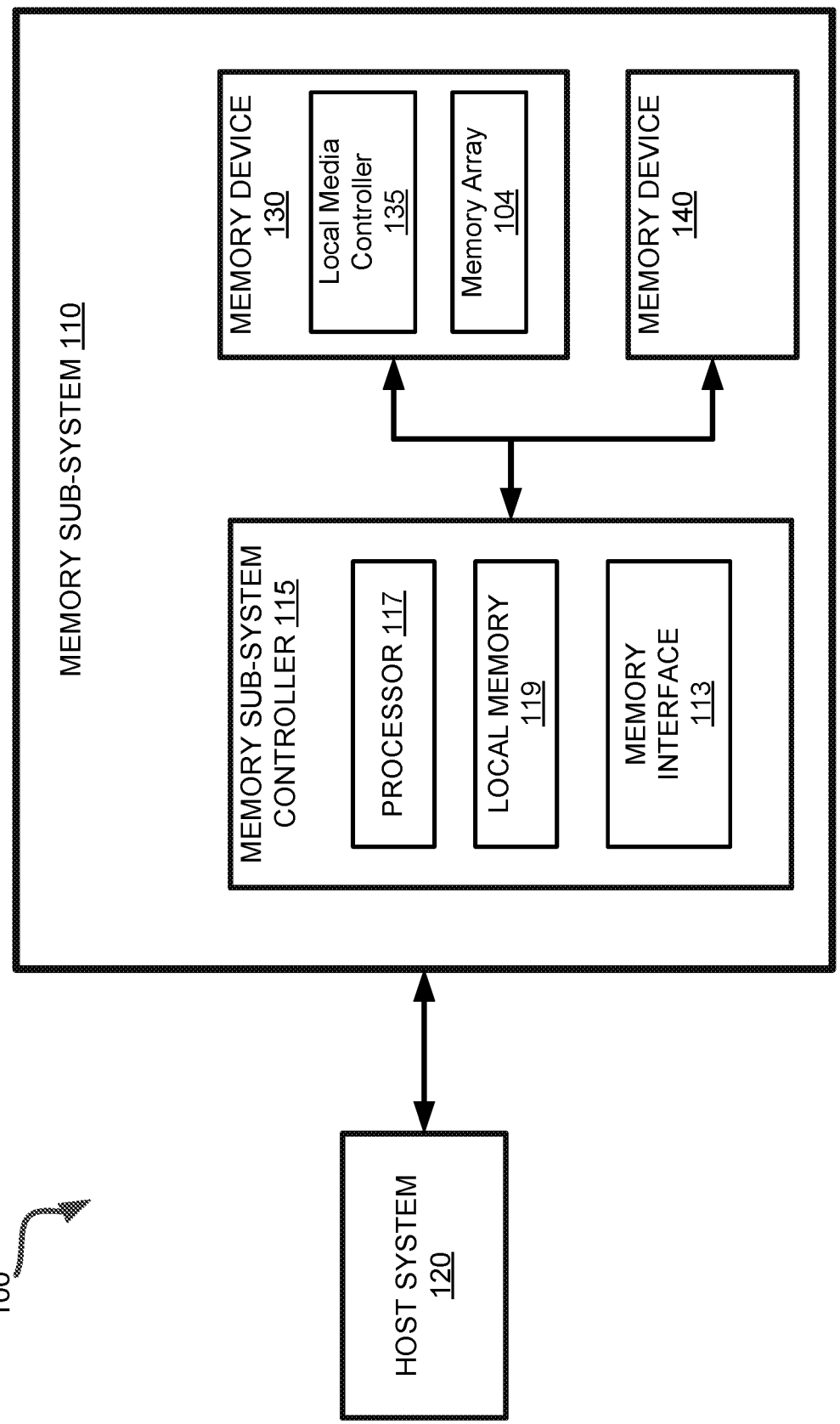
FIG. 1A illustrates an example computing system that includes a memory sub-system in accordance with some embodiments of the present disclosure.

Aspects of the present disclosure are directed to ganged single level cell (SLC) verify in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

During a program operation on a non-volatile memory device, certain phases can be encountered, including program and program verify. For example, a high program voltage can be applied to a selected wordline of a block of the memory device during a program phase, followed by a program verify phase where a verify voltage is applied to the selected wordline. Certain program operations, can be double program operations, for example, where two sub-blocks are programmed in one operation. In such a double program operation, the two sub-blocks can be programmed (i.e., two separate programming pulses can be applied) before the program verify phase occurs. Depending on the implementation, certain memory devices can utilize either a double verify operation or a seamless verify operation during the subsequent program verify phase. In a double verify operation, the program verify voltage is applied to the selected wordline in two separate pulses, during each of which the current in a corresponding sub-block (i.e., the current through a memory string that forms the sub-block) is sensed by separately activating a respective select gate device connecting the sub-block to a common bitline. Thus, there is a latency associated with the two separate pulses (and corresponding sensing operations) including additional time related to ramping up and down the program verify voltage two times. In a seamless verify operation, the program verify voltage is applied to the selected wordline only once, and the current in the two sub-blocks is sensed consecutively (i.e., by first activating one select gate device and then subsequently activating the other select gate device). Thus the latency with two separate sensing operations is still present, although it is slightly mitigated by only ramping up and down the program verify voltage once. The total latency, however, still increases the length of the program operation, which can be especially impactful in high-priority and time-sensitive operations, such single level cell (SLC) programming operations.

Aspects of the present disclosure address the above and other deficiencies by implementing ganged single level cell (SLC) verify in a memory device of a memory sub-system. In a ganged SLC verify operation, control logic in the memory device can concurrently verify (i.e., at least partially overlapping in time) that memory cells in two separate sub-blocks were successfully programmed with data from two separate pages using a single sensing operation. When multiple sub-blocks are programmed in a single program operation, the control logic can enable the memory strings corresponding to both sub-locks concurrently (e.g., simultaneously) during a subsequent program verify phase. Since the wordlines in the block, including both the selected wordline being programmed and the unselected wordlines, are common to both sub-blocks, no change in biasing to the wordlines is required. Since the memory strings that form both sub-blocks can independently sink current from a common bitline, the ganged verify operation cannot be used to inhibit cells that have passed the program verify (i.e., that have reached a target programming voltage level). Thus, as the program operation progresses, the width of the programming distributions will track the natural program variation of cells. Thus, the ganged SLC verify can be used to make a pass or fail determination for the associated program operation. During ganged SLC verify, in one embodiment, only pairs of cells (i.e., from pairs of sub-blocks) where both cells are programmed are sensed. Since the cells are sensed together as a pair, the total number of total bits being verified is cut in half as compared to either a double verify operation or a seamless verify operation, and a passing result will indicate that both cells have been programmed to a voltage level above the program verify level. To determine a number of bytes that fail the program verify the control logic can count a single fail in a bit as a failing byte. Thus, when the number bytes that fail the program verify satisfies a threshold criterion (e.g., is below a certain threshold level), the control logic can determine that the program verify was successful and can move on to a subsequent program operation.

Advantages of this approach include, but are not limited to, improved performance in the memory device. The ganged SLC verify operation described herein allows for the programming of multiple SLC pages to be concurrently (e.g., simultaneously) verified in a single verify operation. This results in fewer verify operations being performed (e.g., one half the number of verify operations) for the same amount of data being programmed to the memory device. Accordingly, the latency associated with the entire programming operation is reduced which can improve SLC programming performance.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135 and a memory array 104. As described herein, local media controller 135 can perform a program operation on the memory cells of memory array 104. A program operation can include, for example, a program phase and a program verify phase. During the program phase, a program voltage is applied to a selected wordline(s) of the memory array 104, in order to program a certain level(s) of charge to selected memory cells on the wordline(s) representative of a desired value(s). During the program verify phase, a read voltage is applied to the selected wordline(s) to read the level(s) of charge stored at the selected memory cells to confirm that the desired value(s) was properly programmed. In one embodiment, local media controller 135 can utilize a ganged single level cell (SLC) verify operation to concurrently verify (i.e., at least partially overlapping in time) that memory cells in two separate sub-blocks of a block of memory array 104 were successfully programed with data from two separate pages using a single sensing operation. In one embodiment, the local media controller 135 can identify a set of memory cells in a block of memory array 104, wherein the set of memory cells comprises two or more memory cells programmed during the program phase of the program operation and associated with a selected wordline of the memory array 104. The local media controller 135 can further cause a program verify voltage to be applied to the selected wordline during the program verify phase of the program operation and perform concurrent sensing operations on the set of memory cells to determine whether each memory cell in the set of memory cells was programmed to at least the program verify voltage during the program phase. Such a process can be repeated for multiple sets of memory cells in the block of memory array 104 and local media controller 135 can track (e.g., using a counter) a number of pairs that failed to be programmed to at least the program verify voltage. If the number of sets of memory cells that failed to be programmed satisfies a threshold criterion (e.g., is less than a threshold number), local media controller 135 can determine that the block has passed the program verify phase. If the number of sets of memory cells that failed to be programmed does not satisfy the threshold criterion (e.g., is greater than or equal to a threshold number), local media controller 135 can determine that the block has failed the program verify phase. Further details with regards to the operations of local media controller 135 are described below.

Figure 1B:
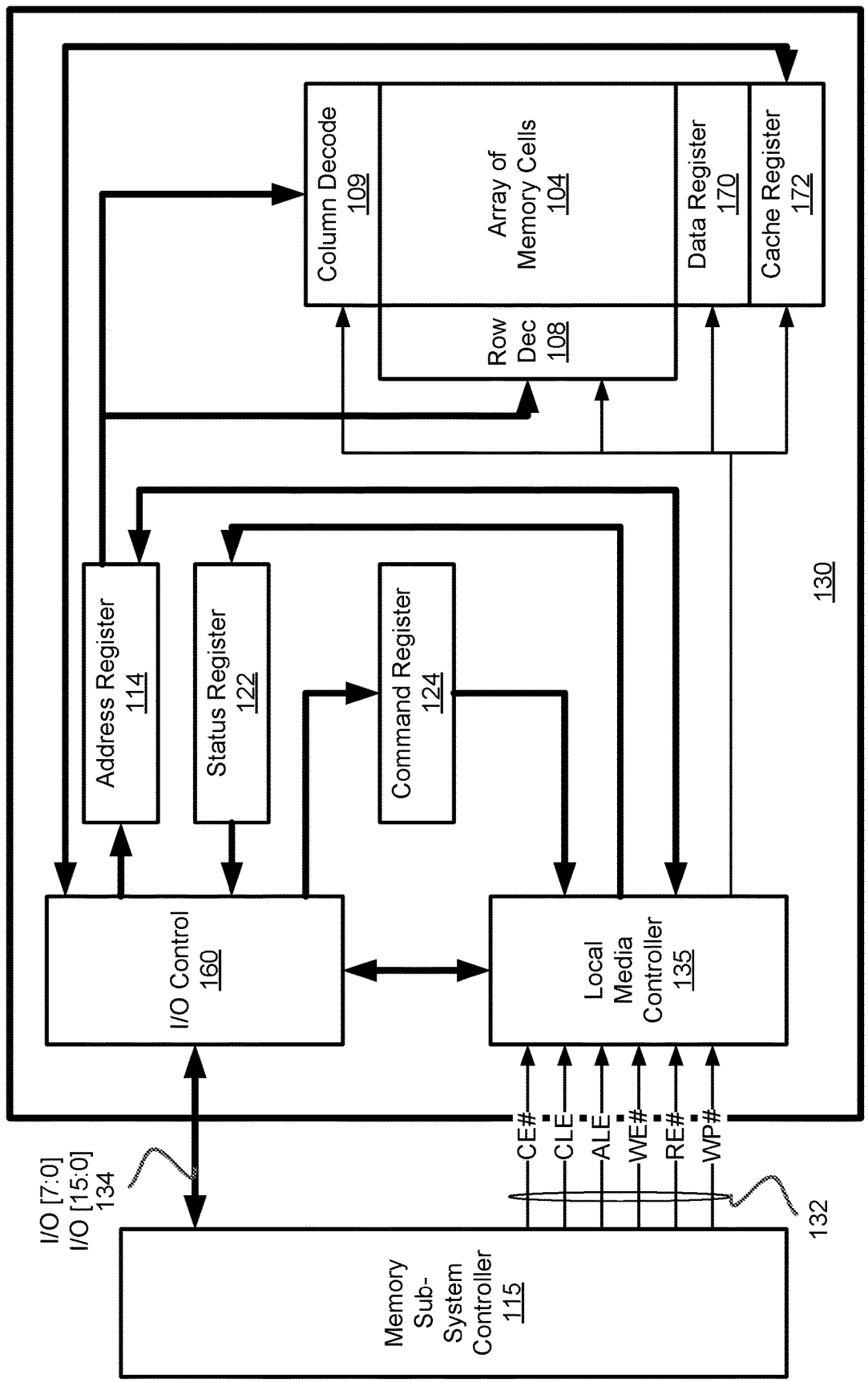
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 can perform a ganged single level cell (SLC) verify operation to concurrently verify (i.e., at least partially overlapping in time) that memory cells in two separate sub-blocks of a block of memory array 104 were successfully programed with data from two separate pages using a single sensing operation.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
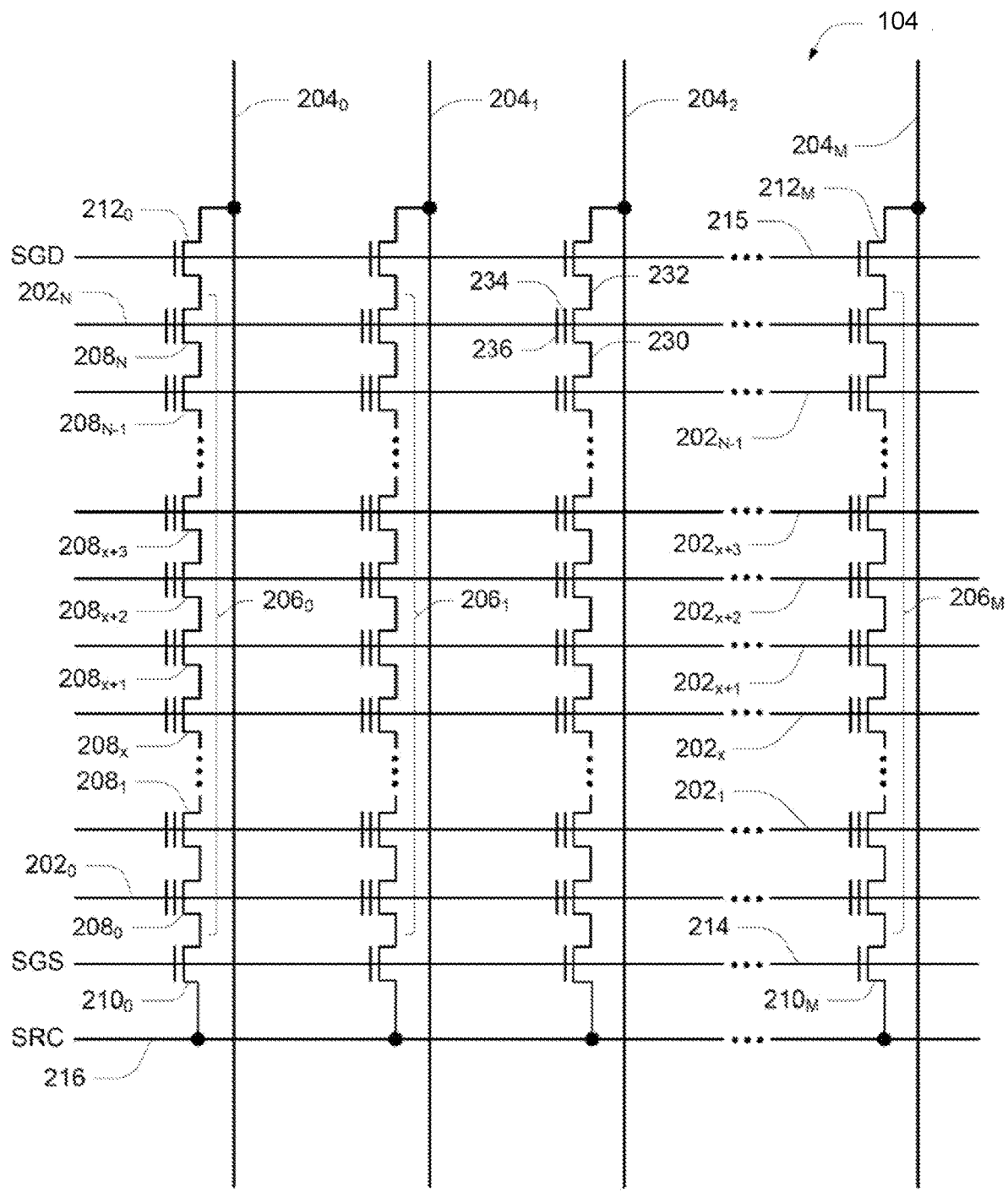
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
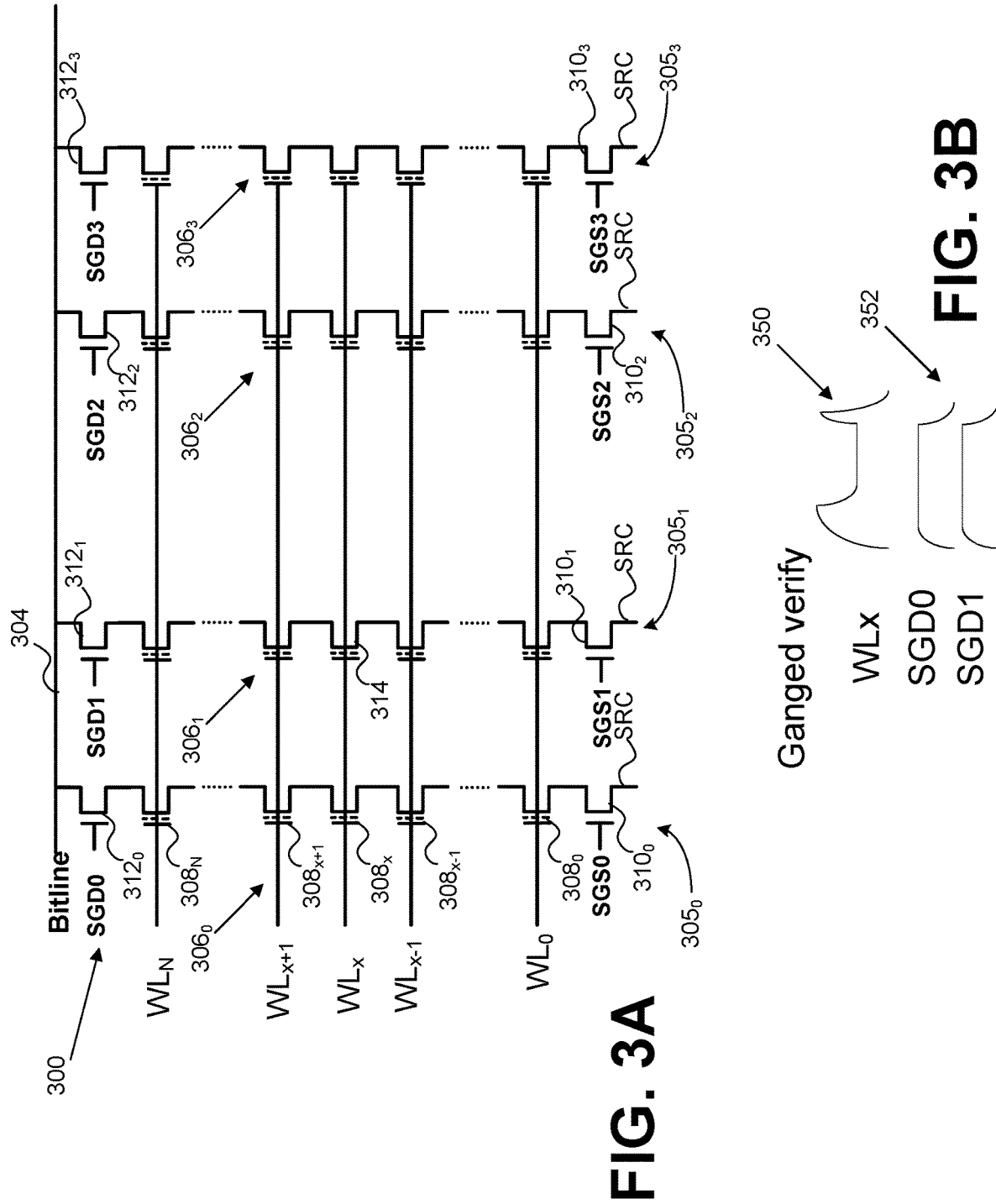
FIG. 3A is a schematic of portions of an array of memory cells implementing ganged single level cell (SLC) verify in accordance with some embodiments of the present disclosure.
FIG. 3B is a signal diagram illustrating various signals applied to a memory array during a ganged single level cell (SLC) verify in accordance with some embodiments of the present disclosure.

FIG. 3A is a schematic of portions of an array of memory cells implementing ganged single level cell (SLC) verify in accordance with some embodiments of the present disclosure. The portion of the array of memory cells, such as memory array 104, can be a block 300, for example. In one embodiment, the block 300 includes strings of memory cells that can be grouped into sub-blocks, such as sub-blocks $305_0$-$305_3$. Other numbers of sub-blocks can be included in other embodiments.

Specifically, in at least some embodiments, the block 300 includes a bit line 304, where each sub-block is coupled to the bit line 304. The first sub-block $305_0$ can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the first string of memory cells $306_0$ includes multiple memory cells $308_0 \ldots 308_N$. Each SGS transistor can be connected to a common source (SRC), such as a source voltage line, to provide voltage to the sources of the multiple memory cells $308_0 \ldots 308_N$. In some embodiments, the source voltage line includes a source plate that supplies the source voltage. In at least some embodiments, multiple wordlines (WLs) are coupled with gates of memory cells of each string of memory cells $306_0 \ldots 306_3$.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to the gate of the first SGS transistor $310_0$, a second source select gate line (SGS1) can be connected to the gate of the second SGS transistor $310_1$, a third source select gate line (SGS2) can be connected to the gate of the third SGS transistor $310_2$, and a fourth source select gate line (SGS3) can be connected to the gate of the fourth SGS transistor $310_3$.

In on embodiment, local media controller 135 can perform a ganged single level cell (SLC) verify operation to concurrently verify (i.e., at least partially overlapping in time) that memory cells in two separate sub-blocks of block 300 were successfully programmed with data from two separate pages using a single sensing operation. In one embodiment, the local media controller 135 can identify a set of memory cells in block 300, such as memory cells $308_x$ and 314 that were programmed during the program phase of a program operation. Memory cells $308_x$ and 314 are associated with a selected wordline WLx and are each associated with different sub-blocks and memory strings. For example, memory cell $308_x$ is part of memory string $306_0$ which forms sub-block $305_0$ and memory cell 314 is part of memory string $306_1$ which forms sub-block $305_1$. In one embodiment, the set of memory cells includes two memory cells, however, in other embodiments, the set of memory cells can include additional memory cells. In one embodiment, the memory cells in the set of memory cells are part of adjacent sub-blocks within block 300, however, in other embodiments, the memory cells in the set of memory cells can be non-adjacent.

In one embodiment, to perform the ganged SLC verify operation, the local media controller 135 can cause a program verify voltage to be applied to the selected wordline, such as WLx, during the program verify phase of the program operation. The local media controller 135 can further perform concurrent sensing operations on the set of memory cells to determine whether each memory cell in the set of memory cells was programmed to at least the program verify voltage during the program phase. As illustrated in FIG. 3B, local media controller 135 can cause a single pulse having the program verify voltage level 350 to be applied to the selected wordline and concurrently (e.g., simultaneously) activate respective select gate devices, such as first SGD transistor $312_0$ and second SGD transistor $312_1$. For example, signals 352 on the first drain select gate line (SGD0) and on the second drain select gate line (SGD1) can be driven high concurrently. During these concurrent sensing operations, local media controller 135 can determine whether a current from the shared bitline 304 flows through each respective memory string, such as memory strings $306_0$ and $306_1$, including the memory cells, such as memory cells $308_x$ and 314, in the set of memory cells. The current from the shared bitline 304 does not flow through the respective memory strings if the memory cells in the set of memory cells was programmed to at least the program verify voltage during the program phase of the program operation, which is indicative of the set of memory cells passing the program verify phase.

Such a process can be repeated for multiple sets of memory cells in the block 300 and local media controller 135 can track (e.g., using a counter) a number of sets that failed to be programmed to at least the program verify voltage. If the number of sets of memory cells that failed to be programmed satisfies a threshold criterion (e.g., is less than a threshold number), local media controller 135 can determine that the block 300 has passed the program verify phase. If the number of sets of memory cells that failed to be programmed does not satisfy the threshold criterion (e.g., is greater than or equal to a threshold number), local media controller 135 can determine that the block 300 has failed the program verify phase.

Figure 4:
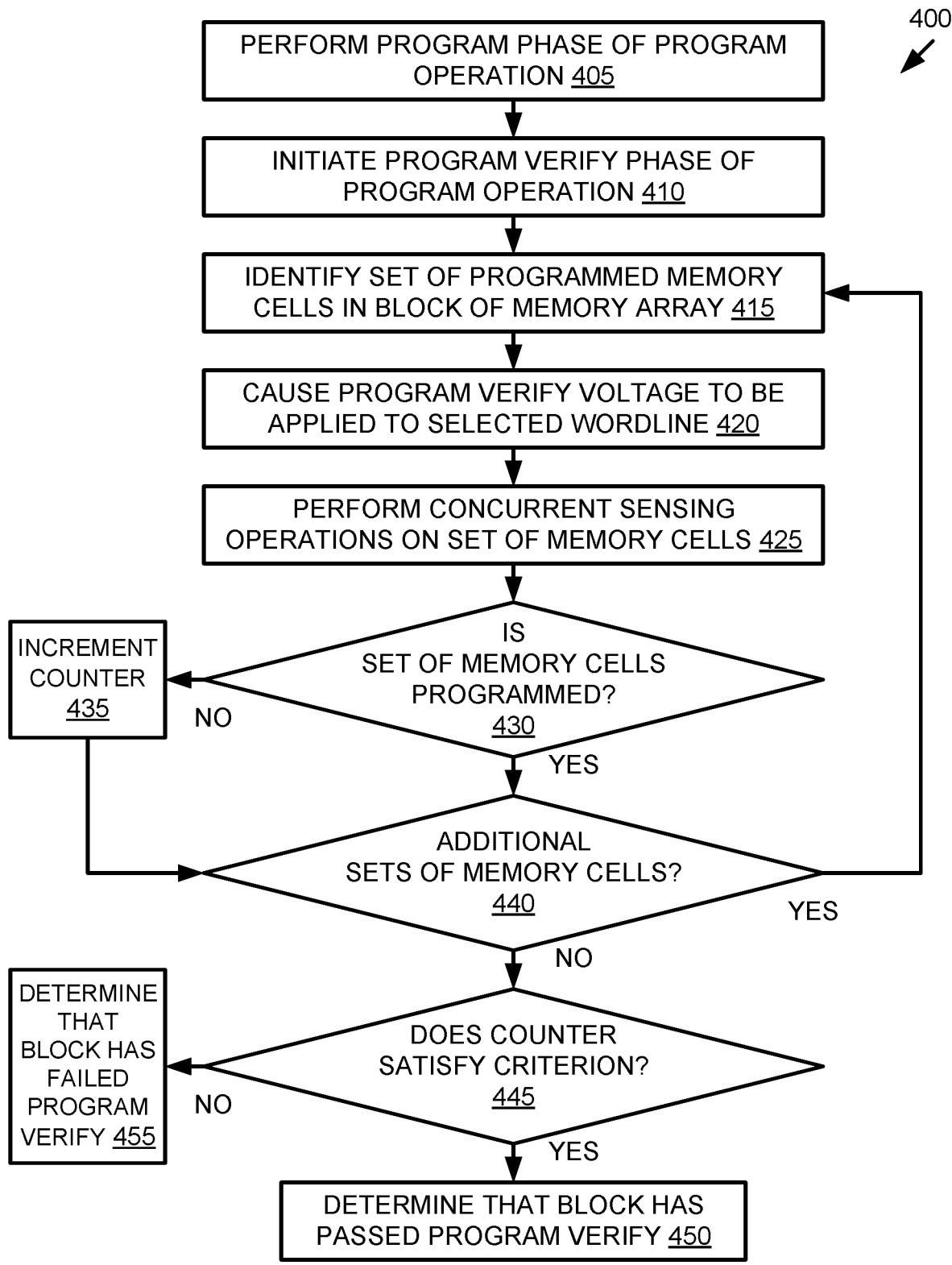
FIG. 4 is a flow diagram of an example method of ganged single level cell (SLC) verify in a memory device of a memory sub-system in accordance with some embodiments of the present disclosure.

FIG. 4 is a flow diagram of an example method of ganged single level cell (SLC) verify in a memory device of a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, memory cells are programmed. For example, processing logic (e.g., local media controller 135) can perform a program phase of a program operation. In one embodiment, the processing logic can cause a double pulse having a program voltage level to be applied to a selected wordline of a block of a memory array, such as wordline WLx of block 300 of memory array 104 of memory device 130, as shown in FIG. 3A. Such a double pulse can program a set of memory cells, such as memory cells $308_x$ and 314, associated with the selected wordline with respective bits from two separate pages of data. In other embodiments, some other number of memory cells, or a different set of memory cells, can be programmed during the program phase.

At operation 410, the programmed memory cells are verified. For example, the processing logic can initiate a program verify phase of the program operation. In one embodiment, the program verify phase is initiated in response to completion of the program phase. As described in more detail below, during the program verify phase, a read voltage is applied to the selected wordline, such as WLx, to read the level of charge stored at the selected memory cells to confirm that the desired value was properly programmed.

At operation 415, a set of memory cells is identified. For example, the processing logic can identify a set of memory cells in block 300, such as memory cells $308_x$ and 314 that were programmed during the program phase of the program operation. Memory cells $308_x$ and 314 are associated with a selected wordline WLx and are each associated with different sub-blocks and memory strings. For example, memory cell $308_x$ is part of memory string $306_0$ which forms sub-block $305_0$ and memory cell 314 is part of memory string $306_1$ which forms sub-block $305_1$. In one embodiment, all of the memory cells in the set of memory cells are memory cells that were programmed during the program operation (i.e., that are storing a certain level of charge representing a desired value, as opposed to those memory cells that were not programmed to any specific voltage level).

At operation 420, a voltage is applied to the memory array. For example, the processing logic can cause a program verify voltage to be applied to the selected wordline, such as WLx, during the program verify phase of the program operation. In one embodiment, as illustrated in FIG. 3B, local media controller 135 can cause a single pulse having the program verify voltage level 350 to be applied to the selected wordline. In one embodiment, the program verify voltage level has a lower magnitude than the program voltage level.

At operation 425, sensing operations are performed. For example, the processing logic can perform concurrent sensing operations on the set of memory cells to determine whether each memory cell in the set of memory cells was programmed to at least the program verify voltage during the program phase of the program operation. In one embodiment, while the program verify voltage is applied to the selected wordline, local media controller 135 can concurrently (e.g., simultaneously) activate respective select gate devices, such as first SGD transistor $312_0$ and second SGD transistor $312_1$, corresponding to the memory cells in the identified set of memory cells. For example, signals 352 on the first drain select gate line (SGD0) and on the second drain select gate line (SGD1) can be driven high concurrently.

At operation 430, a determination is made. For example, the processing logic can determine whether the set of memory cells was programmed. During the concurrent sensing operations, local media controller 135 can determine whether a current from the shared bitline 304 flows through each respective memory string, such as memory strings $306_0$ and $306_1$. The current from the shared bitline 304 does not flow through the respective memory strings if the memory cells in the set of memory cells was programmed to at least the program verify voltage during the program phase of the program operation, which is indicative of the set of memory cells passing the program verify phase. Conversely, the current from the shared bitline 304 does flow through the respective memory strings if the memory cells in the set of memory cells was not programmed to at least the program verify voltage during the program phase of the program operation, which is indicative of the set of memory cells failing the program verify phase.

If the set of memory cells was not programmed, at operation 435, a counter is incremented. For example, the processing logic can maintain a counter, such as a count fail byte (CFBYTE) counter. In one embodiment, the counter is incremented in each instance where it is determined that all of the memory cells in a given set of memory cells was not adequately programmed (i.e., was not programmed to at least the program verify voltage). Thus, the value of the counter tracks a number of sets of memory cells that failed to be programmed to at least the program verify voltage.

Once it is either determined at operation 430 that the set of memory cells was programmed, or the counter is incremented at operation 435, processing can continue to operation 430. At operation 440, a determination is made. For example, the processing logic can determine whether there are additional sets of memory cells to be verified. As described above, a set of memory cells can include two or more memory cells of all the memory cells in a block that were programmed during the program phase of the program operation. In one embodiment, each of these memory cells is assigned to a set of memory cells which can be verified using ganged SLC verify, as described herein. In one embodiment, if there is a certain group of cells to verify, the group could be separated into sets, where a different ganged verify operation is performed on each set. For example, in an SLC case, if four sub-blocks are programmed together, all 4 sub-blocks could be ganged together for a single verify operation, or two separate ganged verify operations could be performed on two sub-blocks each. Other embodiments, could utilize different verify levels, either for SLC memory or other memory types, such as TLC, QLC, etc. Accordingly, if there are additional sets of memory cells to be verified, processing can return to operation 415, and operations 415-435 can be repeated. If there are no additional sets of memory cells to be verified (i.e., if all memory cells have been verified), processing can continue to operation 445.

At operation 445, a determination is made. For example, the processing logic can determine whether the counter satisfies a threshold criterion. If the number of sets of memory cells that failed to be programmed satisfies the threshold criterion (e.g., is less than a threshold number), at operation 450, the processing logic can determine that the block 300 has passed the program verify phase. Subsequently, a new program operation can be initiated. If the number of sets of memory cells that failed to be programmed does not satisfy the threshold criterion (e.g., is greater than or equal to a threshold number), at operation 455, the processing logic can determine that the block 300 has failed the program verify phase. Subsequently, an additional program phase(s) and program verify phase(s) of the previous program operation can be performed to ensure that the memory cells are properly programmed to their target voltage levels.

Figure 5:
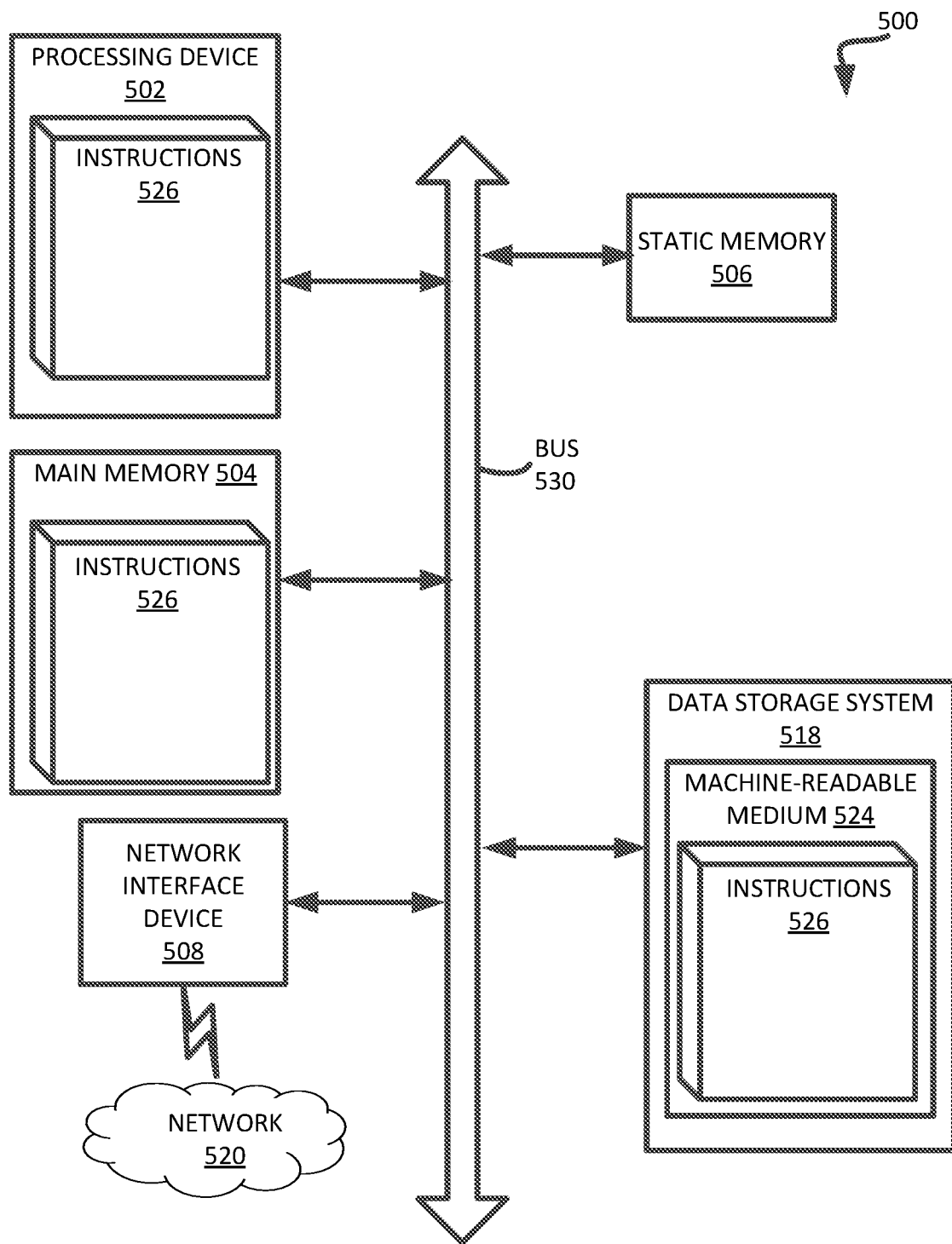
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the local media controller 135 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
identifying a set of memory cells in a block of the memory array, wherein the set of memory cells comprises two or more memory cells programmed during a program phase of a program operation and associated with a selected wordline of the memory array;
causing a program verify voltage to be applied to the selected wordline during a program verify phase of the program operation;
performing concurrent sensing operations on the set of memory cells to determine whether each memory cell in the set of memory cells was programmed to at least the program verify voltage during the program phase of the program operation; and
responsive to determining that each memory cell in the set of memory cells was not programmed to at least the program verify voltage during the program phase of the program operation, incrementing a value of a counter, wherein the value of the counter represents whether the block of the memory array has passed the program verify phase of the program operation.

2. The memory device of claim 1, wherein the control logic is to perform operations further comprising:
perform the program phase of the program operation; and
initiate the program verify phase of the program operation in response to completion of the program phase of the program operation.

3. The memory device of claim 1, wherein two or more memory cells in the set of memory cells are each associated with an adjacent sub-block of the block of the memory array.

4. The memory device of claim 1, wherein the two or more memory cells in the set of memory cells are each associated with a different respective memory string of the memory array.

5. The memory device of claim 4, wherein performing the concurrent sensing operations comprises:
concurrently activating a respective select gate device coupled between each respective memory string and a shared bitline of the memory array; and
sensing whether a current from the shared bitline flows through each respective memory string.

6. The memory device of claim 5, wherein the current from the shared bitline does not flow through each respective memory string if each memory cell in the set of memory cells was programmed to at least the program verify voltage during the program phase of the program operation.

7. The memory device of claim 1, wherein the control logic is to perform operations further comprising:
determining whether there are one or more additional sets of memory cells in the block of the memory array that were programmed during the program phase of the program operation.

8. The memory device of claim 7, wherein the control logic is to perform operations further comprising:
responsive to determining that there are not any additional sets of memory cells in the block of the memory array that were programmed during the program phase of the program operation, determining whether the value of the counter satisfies a threshold criterion; and
responsive to determining that the value of the counter satisfies the threshold criterion, determining that the block of the memory array has passed the program verify phase of the program operation.

9. A method comprising:
identifying a set of memory cells in a block of a memory array, wherein the set of memory cells comprises two or more memory cells programmed during a program phase of a program operation and associated with a selected wordline of the memory array;

causing a program verify voltage to be applied to the selected wordline during a program verify phase of the program operation;

performing concurrent sensing operations on the set of memory cells to determine whether each memory cell in the set of memory cells was programmed to at least the program verify voltage during the program phase of the program operation; and responsive to determining that each memory cell in the set of memory cells was not programmed to at least the program verify voltage during the program phase of the program operation, incrementing a value of a counter, wherein the value of the counter represents whether the block of the memory array has passed the program verify phase of the program operation.

10. The method of claim 9, further comprising:
perform the program phase of the program operation; and
initiate the program verify phase of the program operation in response to completion of the program phase of the program operation.

11. The method of claim 9, wherein two or more memory cells in the set of memory cells are each associated with an adjacent sub-block of the block of the memory array.

12. The method of claim 9, wherein the two or more memory cells in the set of memory cells are each associated with a different respective memory string of the memory array.

13. The method of claim 12, wherein performing the concurrent sensing operations comprises:
concurrently activating a respective select gate device coupled between each respective memory string and a shared bitline of the memory array; and
sensing whether a current from the shared bitline flows through each respective memory string.

14. The method of claim 13, wherein the current from the shared bitline does not flow through each respective memory string if each memory cell in the set of memory cells was programmed to at least the program verify voltage during the program phase of the program operation.

15. The method of claim 9, further comprising:
determining whether there are one or more additional sets of memory cells in the block of the memory array that were programmed during the program phase of the program operation.

16. The method of claim 15, further comprising:
responsive to determining that there are not any additional sets of memory cells in the block of the memory array that were programmed during the program phase of the program operation, determining whether the value of the counter satisfies a threshold criterion; and
responsive to determining that the value of the counter satisfies the threshold criterion, determining that the block of the memory array has passed the program verify phase of the program operation.

17. A memory device comprising:
a memory array; and
control logic, operatively coupled with the memory array, to perform operations comprising:
initiating a program operation on the memory array, the program operation comprising a program phase and a program verify phase; and
causing a double pulse having a program voltage level to be applied to a selected wordline of the memory array during the program phase to program a pair of memory cells associated with the selected wordline;
causing a single pulse having a program verify voltage level to be applied to the selected wordline of the memory array during the program verify phase to concurrently verify that the pair of memory cells were programmed to at least the program verify voltage level during the program phase of the program operation; and
responsive to determining that the pair of memory cells were not programmed to at least the program verify voltage during the program phase of the program operation, incrementing a value of a counter, wherein the value of the counter represents whether a block of the memory array has passed the program verify phase of the program operation.

18. The memory device of claim 17, wherein the pair of memory cells are each associated with a different sub-block of the block of the memory array, and wherein the control logic is to perform operations further comprising:
concurrently activating a respective select gate device associated with each different sub-block during the program verify phase; and
determining whether respective memory strings associated with each different sub-block is conducting.

19. The memory device of claim 18, wherein the control logic is to perform operations further comprising:
responsive to determining that the respective memory strings associated with each different sub-block is conducting, incrementing the value of the counter; and
determining whether there are one or more additional pairs memory cells in the block of the memory array that were programmed during the program phase of the program operation.

20. The memory device of claim 19, wherein the control logic is to perform operations further comprising:
responsive to determining that there are not any additional sets of memory cells in the block of the memory array that were programmed during the program phase of the program operation, determining whether the value of the counter satisfies a threshold criterion; and
responsive to determining that the value of the counter satisfies the threshold criterion, determining that the block of the memory array has passed the program verify phase of the program operation.

* * * * *